(12) United States Patent
Li

(10) Patent No.: US 11,925,099 B2
(45) Date of Patent: Mar. 5, 2024

(54) FLEXIBLE SUBSTRATE, MANUFACTURING METHOD THEREOF, AND FLEXIBLE DISPLAY DEVICE

(71) Applicant: Shenzhen China Star Optoelectronics Semiconductor Display Technology Co., Ltd., Guangdong (CN)

(72) Inventor: Linshuang Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 737 days.

(21) Appl. No.: 17/051,262

(22) PCT Filed: Oct. 14, 2020

(86) PCT No.: PCT/CN2020/120761
§ 371 (c)(1),
(2) Date: Oct. 28, 2020

(87) PCT Pub. No.: WO2022/047895
PCT Pub. Date: Mar. 10, 2022

(65) Prior Publication Data
US 2023/0133423 A1 May 4, 2023

(30) Foreign Application Priority Data

Sep. 3, 2020 (CN) .......................... 202010913338.1

(51) Int. Cl.
*H10K 77/10* (2023.01)
*H10K 102/00* (2023.01)

(52) U.S. Cl.
CPC ...... *H10K 77/111* (2023.02); *H10K 2102/311* (2023.02)

(58) Field of Classification Search
CPC .................. H10K 77/111; H10K 2102/311
USPC .......................................... 174/254
See application file for complete search history.

(56) References Cited

U.S. PATENT DOCUMENTS

| 6,740,416 | B1 * | 5/2004 | Yokogawa | H10K 50/85 |
| | | | | 428/209 |
| 9,049,778 | B2 * | 6/2015 | Kyung | G03F 7/031 |
| 10,626,240 | B2 * | 4/2020 | Sakaguchi | C08G 73/1071 |
| 2008/0274282 | A1 * | 11/2008 | Bent | C23C 16/45525 |
| | | | | 427/255.28 |
| 2017/0355829 | A1 * | 12/2017 | Sakaguchi | B01J 13/0091 |

(Continued)

FOREIGN PATENT DOCUMENTS

CN 107170778 9/2017
CN 107393859 11/2017

(Continued)

*Primary Examiner* — Timothy J Thompson
*Assistant Examiner* — Michael F McAllister

(57) ABSTRACT

A flexible substrate, a manufacturing method thereof, and a flexible display device are provided. The method includes: step S10, forming a first aerogel layer with a cross-linked structure and a nanoporous structure on a substrate; step S20: forming an inorganic layer on the first aerogel layer; step S30, forming a second flexible substrate layer on the first aerogel layer, and allowing the second flexible substrate layer to cover the inorganic layer; and step S40, peeling the first aerogel layer, the inorganic layer, and the second flexible substrate layer from the substrate to form the flexible substrate.

18 Claims, 2 Drawing Sheets

(56) References Cited

U.S. PATENT DOCUMENTS

2018/0112054 A1* 4/2018 Steiner, III ........... C08G 18/092
2018/0342702 A1* 11/2018 Hu ...................... H01L 31/0547
2021/0336167 A1* 10/2021 Li ........................ H10K 77/111

FOREIGN PATENT DOCUMENTS

| CN | 107507929 | 12/2017 |
| CN | 107742618 | 2/2018 |
| CN | 108470757 | 8/2018 |
| CN | 111508365 | 8/2020 |
| CN | 111524905 | 8/2020 |
| JP | WO2019/116150 | 1/2021 |

* cited by examiner

FLEXIBLE SUBSTRATE, MANUFACTURING METHOD THEREOF, AND FLEXIBLE DISPLAY DEVICE

RELATED APPLICATIONS

This application is a National Phase of PCT Patent Application No. PCT/CN2020/120761 having International filing date of Oct. 14, 2020, which claims the benefit of priority of Chinese Patent Application No. 202010913338.1 filed on Sep. 3, 2020. The contents of the above applications are all incorporated by reference as if fully set forth herein in their entirety.

FIELD AND BACKGROUND OF THE INVENTION

The present application relates to the field of display technology, and in particular to a flexible substrate, a manufacturing method thereof, and a flexible display device with the flexible substrate.

Self-luminous display technology, such as organic light-emitting diode (OLED) and micro light-emitting diode (micro-LED), has characteristics of high contrast, fast response times, wide viewing angles, and wide color gamut, and has become a next-generation display technology. The self-luminous technology gives display panels broader application scope.

In the prior art, polyimide has become a best choice for material of flexible self-luminous substrates because of its excellent heat resistance and low thermal expansion coefficient. When manufacturing a flexible substrate, separation of the flexible substrate and a glass substrate is mainly achieved by a laser lift-off process. The specific process steps include: irradiating laser to a bottom surface of the glass substrate to ablate the polyimide at an interface between the flexible substrate and the glass substrate, and air pressure generated after the ablation of polyimide is utilized to separate the flexible substrate from the glass substrate. However, the air pressure generated from the separation interface will have an impact on the flexible substrate, which may cause the flexible substrate to wrinkle or even crack.

The present application provides a flexible substrate, a manufacturing method thereof, and a flexible display device. This method can solve the technical problem in the prior art that when a flexible substrate is separated from a substrate, the air pressure generated from the separation interface will have an impact on the flexible substrate, which further causes the flexible substrate to wrinkle or even crack.

SUMMARY OF THE INVENTION

In order to solve the above technical problems, an embodiment of the present application provides a method of manufacturing a flexible substrate. The method includes: step S10, forming a first aerogel layer on the substrate, wherein the first aerogel layer has a cross-linked structure and a nanoporous structure; step S20: forming an inorganic layer on the first aerogel layer; step S30, forming a second flexible substrate layer on the first aerogel layer, and allows the second flexible substrate layer covering the inorganic layer; and step S40, peeling the first aerogel layer, the inorganic layer, and the second flexible substrate layer from the substrate to form the flexible substrate.

In an embodiment of the present application, the step S10 further includes: step S101, preparing a polyamic acid solution and coating the polyamic acid solution on the substrate; step S102, performing a supercritical extraction on the polyamic acid solution to obtain a polyamic acid gel film; and step S103: performing a curing treatment on the polyamic acid gel film to obtain the first aerogel layer.

In an embodiment of the present application, the curing treatment in the step S103 further includes a thermal imidization curing treatment, and the thermal imidization curing treatment includes a first imidization and a second imidization, wherein the polyamic acid gel film is subjected to the first imidization to obtain a polyamic acid aerogel film, and the polyamic acid aerogel film is subjected to the second imidization to obtain the first aerogel layer.

In an embodiment of the present application, a temperature of the first imidization ranges from 80° C. to 100° C., and a temperature of the second imidization is greater than 400° C.

In an embodiment of the present application, the inorganic layer includes a plurality of inorganic columnar structures, and the plurality of inorganic columnar structures are disposed on the first aerogel layer and are covered by the second flexible substrate layer.

In an embodiment of the present application, a thickness of the inorganic layer ranges from 2000 angstroms to 4000 angstroms, and each of the plurality of inorganic columnar structures includes a single-layer structure or a multilayer structure of silicon nitride or silicon oxide or includes a multilayer structure stacked by silicon nitride and silicon oxide.

In an embodiment of the present application, a material of the second flexible substrate layer includes polyimide.

In an embodiment of the present application, in step S40, a laser lift-off process is performed to peel the first aerogel layer, the inorganic layer, and the second flexible substrate layer to form the flexible substrate.

According to the above objective of the present application, a flexible substrate is provided, the flexible substrate includes: a first aerogel layer, wherein the first aerogel layer includes a cross-linked structure and a nanoporous structure; an inorganic layer disposed on the first aerogel layer, wherein the inorganic layer includes a plurality of inorganic columnar structures disposed on the first aerogel layer; and a second flexible substrate layer disposed on the first aerogel layer and covering the plurality of inorganic columnar structures.

In an embodiment of the present application, a thickness of the inorganic layer ranges from 2000 angstroms to 4000 angstroms, and each of the plurality of inorganic columnar structures includes a single-layer structure or a multilayer structure of silicon nitride or silicon oxide or includes a multilayer structure stacked by silicon nitride and silicon oxide.

In an embodiment of the present application, a material of the second flexible substrate layer comprises polyimide.

In an embodiment of the present application, a porosity of the first aerogel layer is greater than 50%.

In an embodiment of the present application, a diameter of a nanopore of the nanoporous structure is less than 80 nm.

According to the above objective of the present application, a flexible display device is provided. The flexible display device includes a flexible substrate and a display functional layer disposed on the flexible substrate. The flexible substrate includes: a first aerogel layer, wherein the first aerogel layer includes a cross-linked structure and a nanoporous structure; an inorganic layer disposed on the first aerogel layer, wherein the inorganic layer includes a plurality of inorganic columnar structures disposed on the first aerogel layer; and a second flexible substrate layer disposed on the first aerogel layer and covering the plurality of inorganic columnar structures.

In an embodiment of the present application, a thickness of the inorganic layer ranges from 2000 angstroms to 4000 angstroms, and each of the plurality of inorganic columnar structures includes a single-layer structure or a multilayer structure of silicon nitride or silicon oxide or includes a multilayer structure stacked by silicon nitride and silicon oxide.

In an embodiment of the present application, a material of the second flexible substrate layer comprises polyimide.

In an embodiment of the present application, a porosity of the first aerogel layer is greater than 50%.

In an embodiment of the present application, a diameter of a nanopore of the nanoporous structure is less than 80 nm.

Compared with the prior art, the flexible substrate provided by the present application includes a stacked first aerogel layer and a second flexible substrate layer, which greatly improves the bendable performance of the flexible substrate and improves the stability of the flexible substrate. Since the first aerogel layer has a cross-linked structure and a nanoporous structure, it can well absorb the kinetic energy generated by the air pressure during the peeling process, thereby improving the cushioning effect of the flexible substrate on the impact of the air pressure. It prevents the flexible substrate from wrinkling or cracking and improves the yield of the flexible substrate.

BRIEF DESCRIPTION OF THE SEVERAL VIEWS OF THE DRAWINGS

The specific implementation manners of the present application are described in detail below with reference to the accompanying drawings, which will make the technical solutions and beneficial effects of the present application easier to understand.

DESCRIPTION OF SPECIFIC EMBODIMENTS OF THE INVENTION

Figure 1:
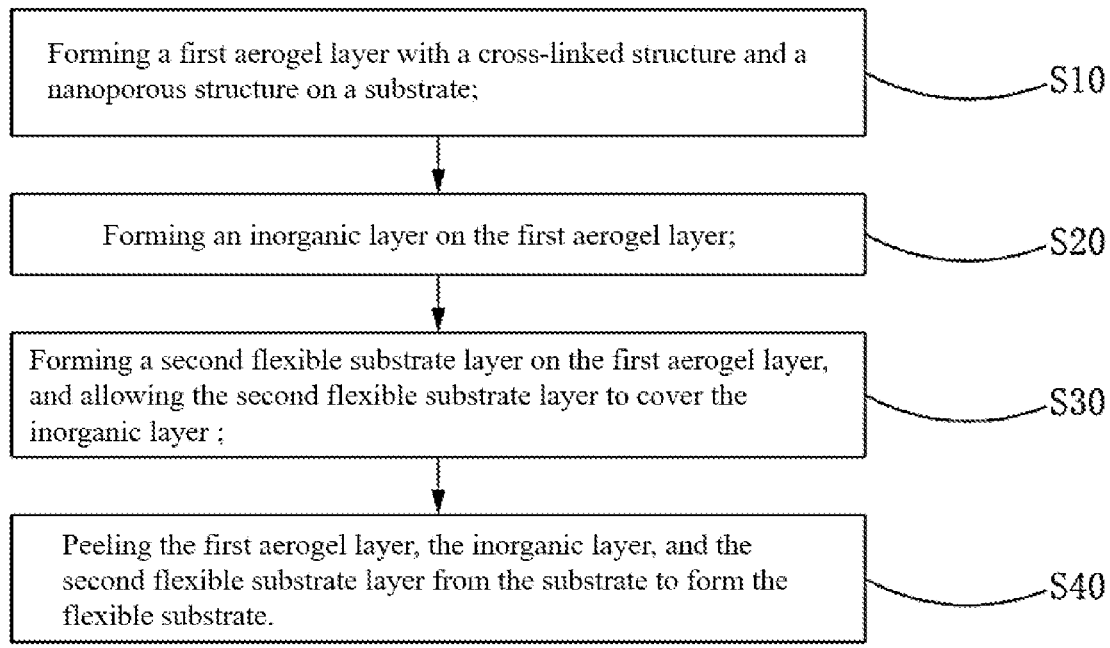
FIG. 1 is a flowchart of a method of manufacturing a flexible substrate provided by an embodiment of the application.

The technical solutions in the embodiments of the present application will be clearly and completely described below with reference to the drawings in the embodiments of the present application. Obviously, the described embodiments are only a part of the embodiments of the present application, rather than all the embodiments. Based on the embodiments in the present application, all other embodiments obtained by those skilled in the art without doing creative work fall within the protection scope of this application.

In the description of the present application, it should be understood that the orientation or positional relationship indicated by the terms "center", "longitudinal", "lateral", "length", "width", "thickness", "above", "below", "front", "back", "left", "right", "upright", "horizontal", "top", "bottom", "inner", "outer", "clockwise", "counterclockwise", etc. are based on the orientation or positional relationship shown in the drawings. It is only for the convenience of describing the application and simplifying the description, rather than indicating or implying that the device or element referred to must have a specific orientation, be constructed and operated in a specific orientation, and therefore cannot be understood as a limitation of the application. In addition, the terms "first" and "second" are only used for descriptive purposes, and cannot be understood as indicating or implying relative importance or implicitly indicating the number of indicated technical features. Therefore, the features defined with "first" and "second" may explicitly or implicitly include one or more of the features. In the description of the present application, "plurality" means two or more than two, unless otherwise specifically defined.

In the description of the present application, it should be noted that the terms "installation", "connected to", or "connection" should be understood in a broad sense, unless otherwise specified and limited. For example, it can be a fixed connection, a detachable connection, or an integral connection. It can be mechanically connected, electrically connected, or can be communicated with each other. It can be directly connected or indirectly connected through an intermediary. It can be a communication between two elements or an interaction relationship between two elements. For those of ordinary skill in the art, the specific meanings of the above terms in the application can be understood according to specific circumstances.

In the present application, unless expressly stipulated and defined otherwise, the first feature above or below the second feature may include direct contact between the first feature and second feature. It may also be included that the first feature and second feature are not in direct contact but in contact with another feature between them. Moreover, the first feature is above the second feature means the first feature being directly above and obliquely above the second feature, or it simply means that a horizontal height of the first feature is higher than that of the second feature. The first feature is below the second feature means the first feature directly below and obliquely below the second feature, or it simply means that a horizontal height of the first feature is lower than that of the second feature.

The following disclosure provides various embodiments or examples for realizing various structures of the present application. To simplify the disclosure of the present application, the components and settings of specific examples are described below. No doubt, they are only examples and are not intended to limit the application. Further, the present application may repeat reference numerals and/or reference letters in different examples, and this repetition is for the purpose of simplification and clarity, and does not indicate the relationship between the various embodiments and/or settings discussed. In addition, this application provides examples of various specific processes and materials, but those of ordinary skill in the art may be aware of the application of other processes and/or the use of other materials.

The present application provides a flexible substrate, a manufacturing method thereof, and a flexible display device. This method can solve the technical problem in the prior art that when a flexible substrate is separated from a substrate, the air pressure generated from the separation interface will have an impact on the flexible substrate, which further causes the flexible substrate to wrinkle or even crack.

In order to solve the above technical problems, an embodiment of the present application provides a method of manufacturing a flexible substrate. Please refer to FIG. 1, FIG. 2 and FIG. 3. The method includes: step S10, forming a first aerogel layer 102 on the substrate 101, wherein the first aerogel layer 102 has a cross-linked structure and a nanoporous structure 1021. step S20: forming an inorganic layer on the first aerogel layer 102. step S30, forming a second flexible substrate layer 104 on the first aerogel layer 102 and covering the inorganic layer; and step S40, peeling the first aerogel layer 102, the inorganic layer, and the second flexible substrate layer 104 from the substrate 101 to form the flexible substrate.

In the implementation process, the current flexible substrate needs to be separated from a substrate by a laser lift-off process during the manufacturing process. The air pressure generated after the ablation of polyimide is utilized to realize the separation of the flexible substrate and the glass substrate. However, the air pressure generated from the separation interface will have an impact on the flexible substrate, which may cause the flexible substrate to wrinkle or even crack. The flexible substrate and the manufacturing method thereof provided in the embodiments of the present application firstly form a first aerogel layer on a substrate, and sequentially form an inorganic layer and a second flexible substrate layer on the first aerogel layer. The cushioning effect of the nanopores in the first aerogel layer on the air pressure prevents the flexible substrate from wrinkling or cracking and improves the yield of the flexible substrate. In addition, the flexible substrate has a double-layer flexible substrate with a first aerogel layer and a second flexible substrate layer, which improves the flexibility and stability of the flexible substrate.

Figure 2:
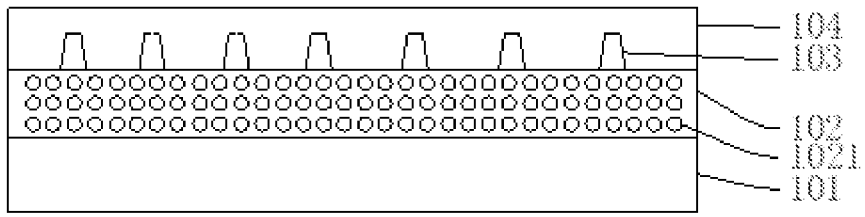
FIG. 2 is a schematic structural diagram of a flexible substrate in a manufacturing process provided by an embodiment of the application.
Figure 3:
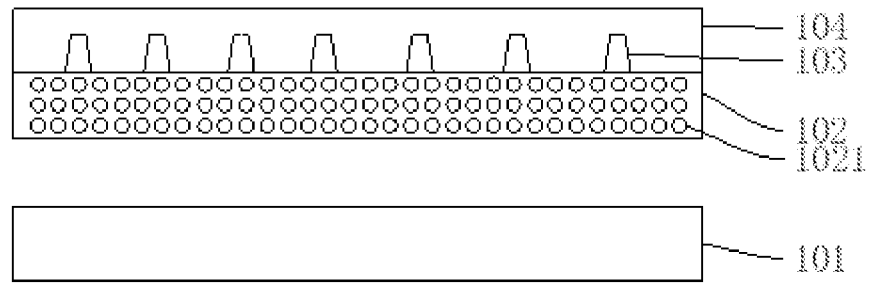
FIG. 3 is a schematic structural diagram of a flexible substrate in a manufacturing process provided by an embodiment of the application.

Specifically, please refer to FIG. 1, FIG. 2, and FIG. 3. The manufacturing method of the flexible substrate provided by the embodiment of the present application will be described in detail below.

Step S10, a first aerogel layer 102 is formed on a substrate 101, wherein the first aerogel layer 102 has a cross-linked structure and a nanoporous structure 1021.

Figure 4:
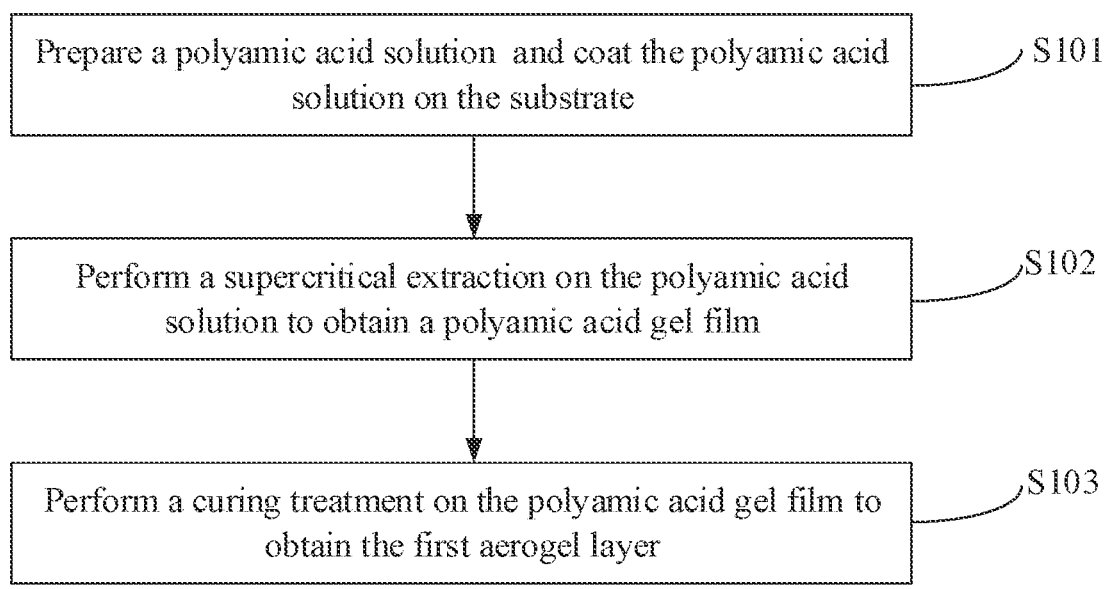
FIG. 4 is a flowchart of a method of forming a first aerogel layer with a cross-linked structure and a nanoporous structure on a substrate provided by an embodiment of the application.

Furthermore, as shown in FIG. 4, the step S10 includes:

Step S101, a polyamic acid solution is prepared and the polyamic acid solution is coated on the substrate 101. The polyamic acid solution can be formed by low-temperature copolymerization of dianhydride, diamine, and polyamine monomers in a polar aprotic solvent, and the substrate 101 can be a glass substrate.

Step S102, a supercritical extraction is performed on the polyamic acid solution to obtain a polyamic acid gel film. Specifically, supercritical carbon dioxide extraction is performed on the polyamic acid solution, so that the polar aprotic solvent in the polyamic acid solution is replaced by supercritical carbon dioxide to obtain a dried polyamic acid gel film.

Step S103: a curing treatment is performed on the polyamic acid gel film to obtain the first aerogel layer 102.

Specifically, the curing treatment includes a thermal imidization curing treatment, and the thermal imidization curing treatment includes a first imidization and a second imidization, wherein the polyamic acid gel film is subjected to the first imidization to slowly release carbon dioxide to obtain a polyamic acid aerogel film, and the polyamic acid aerogel film is subjected to the second imidization, and is dehydrated and cured to form the cross-linked first aerogel layer 102.

The temperature of the first imidization ranges from 80° C. to 100° C., the temperature of the second imidization is greater than 400° C., and the curing rate is greater than 99.5%.

The porosity of the first aerogel layer 102 manufactured by the embodiment of the present application will be greater than 50%, the diameter of a nanopore of the nanoporous structure 1021 is less than 80 nm, and the density is 0.6 g/cm$^3$. Because of the first aerogel layer 102 has a cross-linked structure and the nanoporous structure 1021, the first aerogel layer 102 has extremely high flexibility. In addition, the nanoporous structure 1021 can play a good cushioning effect on the impact of air pressure during the peeling process, and can improve the yield of the flexible substrate.

S20, forming an inorganic layer on the first aerogel layer 102.

The inorganic layer includes a plurality of inorganic columnar structures 103 formed on the first aerogel layer 102. Specifically, each of the plurality of inorganic columnar structures 103 includes a single-layer structure or a multi-layer structure of silicon nitride or silicon oxide, or includes a multilayer structure stacked by silicon nitride and silicon oxide. Each of the inorganic columnar structures 103 can be formed by chemical vapor deposition (CVD) process, photo lithography process, and etching process in sequence. The thickness of the inorganic layer ranges from 2000 angstroms to 4000 angstroms. That is, the thickness of each inorganic columnar structure 103 ranges from 2000 angstroms to 4000 angstroms. In addition, the plurality of inorganic columnar structures 103 can play a role in increasing toughness and increasing adhesion between the first aerogel layer 102 and a second flexible substrate layer 104 formed subsequently, which can improve the stability of the flexible substrate.

Step S30, forming the second flexible substrate layer 104 on the first aerogel layer 102 and covering the inorganic layer.

The polyamic acid solution is coated on the first aerogel layer 102 and the polyamic acid solution covers the plurality of inorganic columnar structures 103, and the polyamic acid solution is cured to obtain the second flexible substrate layer 104. The second flexible substrate layer 104 is a flexible polyimide layer.

The thickness of the first aerogel layer 102 can be 6 μm, and the thickness of the second flexible substrate layer 104 can be 8 μm-10 μm. The first aerogel layer 102, the inorganic layer, and the second flexible substrate layer 104 constitute the flexible substrate, and the first aerogel layer 102 and the second flexible substrate layer 104 cover the inorganic layer (i.e. the plurality of inorganic columnar structures 103).

Step S40, the first aerogel layer 102, the inorganic layer, and the second flexible substrate layer 104 are peeled from the substrate 101 to form the flexible substrate.

Using a laser lift-off process to peel off the flexible substrate to separate the flexible substrate from the substrate 101. That is, the first aerogel layer 102, the inorganic layer, and the second flexible substrate layer 104 are peeled off by a laser lift-off process to form the flexible substrate, wherein, the laser is irradiated to a side of the substrate 101 away from the first aerogel layer 102 to separate the first aerogel layer 102 and the substrate 101. The wavelength of the laser is preferably 308 nm.

As described above, the manufacturing method of the flexible substrate provided by the embodiments of the present application forms a first aerogel layer on the substrate to cushion an impact force generated by the air pressure during the peeling process, preventing wrinkling or cracking when the flexible substrate is peeled off and improving the product yield. In addition, the flexible substrate manufactured in the embodiment of the present application has a double-layer flexible substrate, which further improves the bendability performance and stability of the flexible substrate. Furthermore, a plurality of inorganic columnar structures are formed between the first aerogel layer and the second flexible substrate layer, which enhances the toughness of the flexible substrate and increases the adhesion between the first aerogel layer and the second flexible substrate layer, as well as improves the stability of the flexible substrate.

Please refer to FIG. 3. The embodiments of the present application also provide a flexible substrate, and the flexible substrate includes: a first aerogel layer 102, wherein the first aerogel layer 102 includes a cross-linked structure and a nanoporous structure 1021; an inorganic layer disposed on the first aerogel layer 102, the inorganic layer includes a plurality of inorganic columnar structures 103 disposed on the first aerogel layer 102; and a second flexible substrate layer 104 disposed on the first aerogel layer 102 and covering the plurality of inorganic columnar structures 103.

The first aerogel layer 102 has a cross-linked structure and the nanoporous structure 1021, which can not only absorb the kinetic energy of the air pressure received during the peeling process of the flexible substrate, but also increase the bendable performance of the flexible substrate.

In addition, the embodiment of the present application also provides a flexible display device. The flexible display device includes the flexible substrate described in the above embodiment and a display functional layer provided on the flexible substrate. Due to the first aerogel layer of the flexible substrate and the double-layer flexible substrate structure, the bendable performance, stability, and display effect of the flexible display device are greatly improved.

In the above-mentioned embodiments, the description of each embodiment has its own focus. For parts that are not described in detail in an embodiment, reference may be made to related descriptions of other embodiments.

The flexible substrate and the manufacturing method thereof, and the flexible display device provided by the embodiments of the present application have been described in detail above. Specific embodiments are used to describe the principles and implementation of the application, and the description of the above embodiments is only used to help understand the technical solutions and core ideas of the application. Those of ordinary skill in the art should understand that they can still modify the technical solutions described in the foregoing embodiments, or equivalently replace some of the technical features. These modifications or replacements do not cause the essence of the corresponding technical solutions to deviate from the scope of the technical solutions of the embodiments of the present application.

What is claimed is:

1. A method of manufacturing a flexible substrate, comprising following steps:
   step S10, forming a first aerogel layer with a cross-linked structure and a nanoporous structure on a substrate;
   step S20: forming an inorganic layer on the first aerogel layer;
   step S30, forming a second flexible substrate layer on the first aerogel layer, and allowing the second flexible substrate layer to cover the inorganic layer; and
   step S40, peeling the first aerogel layer, the inorganic layer, and the second flexible substrate layer from the substrate to form the flexible substrate.

2. The method of manufacturing the flexible substrate according to claim 1, wherein the step S10 further comprises:
   step S101, preparing a polyamic acid solution and coating the polyamic acid solution on the substrate;
   step S102, performing a supercritical extraction on the polyamic acid solution to obtain a polyamic acid gel film; and
   step S103: performing a curing treatment on the polyamic acid gel film to obtain the first aerogel layer.

3. The method of manufacturing the flexible substrate according to claim 2, the curing treatment in the step S103 further comprising a thermal imidization curing treatment, and the thermal imidization curing treatment comprising a first imidization and a second imidization, wherein the polyamic acid gel film is subjected to the first imidization to obtain a polyamic acid aerogel film, and the polyamic acid aerogel film is subjected to the second imidization to obtain the first aerogel layer.

4. The method of manufacturing the flexible substrate according to claim 3, wherein a temperature of the first imidization ranges from 80° C. to 100° C., and a temperature of the second imidization is greater than 400° C.

5. The method of manufacturing the flexible substrate according to claim 1, wherein the inorganic layer comprises a plurality of inorganic columnar structures, and the plurality of inorganic columnar structures are disposed on the first aerogel layer and are covered by the second flexible substrate layer.

6. The method of manufacturing the flexible substrate according to claim 5, wherein a thickness of the inorganic layer ranges from 2000 angstroms to 4000 angstroms, and each of the plurality of inorganic columnar structures comprises a single-layer structure or a multilayer structure of silicon nitride or silicon oxide, or comprises a multilayer structure stacked by silicon nitride and silicon oxide.

7. The method of manufacturing the flexible substrate according to claim 1, wherein a material of the second flexible substrate layer comprises polyimide.

8. The method of manufacturing the flexible substrate according to claim 1, wherein in the step S40, a laser lift-off process is performed to peel the first aerogel layer, the inorganic layer, and the second flexible substrate layer to form the flexible substrate.

9. A flexible substrate, comprising:
   a first aerogel layer, wherein the first aerogel layer comprises a cross-linked structure and a nanoporous structure;
   an inorganic layer disposed on the first aerogel layer, wherein the inorganic layer comprises a plurality of inorganic columnar structures disposed on the first aerogel layer; and
   a second flexible substrate layer disposed on the first aerogel layer and covering the plurality of inorganic columnar structures.

10. The flexible substrate according to claim 9, wherein a thickness of the inorganic layer ranges from 2000 angstroms to 4000 angstroms, and each of the plurality of inorganic columnar structures comprises a single-layer structure or a multilayer structure of silicon nitride or silicon oxide or comprises a multilayer structure stacked by silicon nitride and silicon oxide.

11. The flexible substrate according to claim 9, wherein a material of the second flexible substrate layer comprises polyimide.

12. The flexible substrate according to claim 9, wherein a porosity of the first aerogel layer is greater than 50%.

13. The flexible substrate according to claim 9, wherein a diameter of a nanopore of the nanoporous structure is less than 80 nm.

14. A flexible display device, comprising a flexible substrate and a display functional layer disposed on the flexible substrate, the flexible substrate comprising:
- a first aerogel layer, wherein the first aerogel layer comprises a cross-linked structure and a nanoporous structure;
- an inorganic layer disposed on the first aerogel layer, wherein the inorganic layer comprises a plurality of inorganic columnar structures disposed on the first aerogel layer; and
- a second flexible substrate layer disposed on the first aerogel layer and covering the plurality of inorganic columnar structures.

15. The flexible display device according to claim 14, wherein a thickness of the inorganic layer ranges from 2000 angstroms to 4000 angstroms, and each of the plurality of inorganic columnar structures comprises a single-layer structure or a multilayer structure of silicon nitride or silicon oxide or comprises a multilayer structure stacked by silicon nitride and silicon oxide.

16. The flexible display device according to claim 14, wherein a material of the second flexible substrate layer comprises polyimide.

17. The flexible display device according to claim 14, wherein a porosity of the first aerogel layer is greater than 50%.

18. The flexible display device according to claim 14, wherein a diameter of a nanopore of the nanoporous structure is less than 80 nm.

* * * * *